(12) United States Patent
Inuzuka et al.

(10) Patent No.: US 8,425,624 B2
(45) Date of Patent: Apr. 23, 2013

(54) DYEING METHOD AND DYE DEPOSITION APPARATUS

(75) Inventors: Minoru Inuzuka, Nishio (JP); Atsushi Yano, Gamagori (JP)

(73) Assignee: Nidek Co., Ltd., Gamagori-Shi (JP)

( * ) Notice: Subject to any disclaimer, the term of this patent is extended or adjusted under 35 U.S.C. 154(b) by 5 days.

(21) Appl. No.: 13/191,888

(22) Filed: Jul. 27, 2011

(65) Prior Publication Data
US 2012/0023684 A1  Feb. 2, 2012

(30) Foreign Application Priority Data

Jul. 30, 2010  (JP) ................. 2010-171833

(51) Int. Cl.
*D06P 5/28* (2006.01)
(52) U.S. Cl.
USPC ........ 8/471; 8/467; 8/470; 118/641; 118/642; 118/715; 118/720; 118/722
(58) Field of Classification Search ............. 8/506, 507, 8/467, 470, 471; 118/715, 720, 722, 724, 118/729, 641, 642
See application file for complete search history.

(56) References Cited

U.S. PATENT DOCUMENTS

| | | | |
|---|---|---|---|
| 6,520,999 B1 * | 2/2003 | Kamata et al. | 8/471 |
| 2001/0016961 A1 * | 8/2001 | Inuzuka et al. | 8/506 |
| 2011/0018175 A1 * | 1/2011 | Inuzuka et al. | 264/482 |

FOREIGN PATENT DOCUMENTS

JP  A-2001-215306  8/2001

* cited by examiner

*Primary Examiner* — Lorna M Douyon
*Assistant Examiner* — Amina Khan
(74) *Attorney, Agent, or Firm* — Oliff & Berridge, PLC

(57) ABSTRACT

A method of dyeing an object comprising placing a sublimable dye and the object to face each other apart at a predetermined distance of 0.1 mm or more but 10 mm or less under pressure, heating the sublimable dye with a laser to sublimate it toward the object such that the deposition region of the dye is part of a to be dyed region of the object, applying the sublimable dye over the entire to be dyed region of the object by relatively moving the object with respect to the sublimation position of the dye using a moving unit and heating at least a part of the dyed region of the object to fix the dye to the region.

7 Claims, 3 Drawing Sheets

DYEING METHOD AND DYE DEPOSITION APPARATUS

CROSS-REFERENCE TO RELATED APPLICATIONS

This application is based upon and claims the benefit of priority from the prior Japanese Patent Application No. 2010-171833, filed on Jul. 30, 2010, the entire contents of which are incorporated herein by reference.

TECHNICAL FIELD

The present invention relates to a method of dyeing an object to be dyed under normal pressures and a dye deposition apparatus to be used in the dyeing method.

BACKGROUND ART

There is known a method of dyeing an object to be dyed such as a lens by applying (outputting) dyeing inks containing sublimable dye onto a base body such as paper, then placing the base body in noncontact with the object under vacuum, and causing deposition of the sublimable dye toward the object (hereinafter, referred to as a "vapor deposition transfer dyeing method") (see JP2001-215306A for example). This dyeing method enables dyeing of even resin materials which could not conventionally be dyed by a dyeing method conducted by dipping an object to be dyed in a dyeing solution for a predetermined time. This dyeing method can therefore provide such advantages that no problem with waste liquid treatment occurs and the dyeing work is not performed in an environment with bad smell.

DISCLOSURE OF THE INVENTION

Problems to be Solved by the Invention

However, the aforementioned vapor deposition transfer dyeing method needs to perform the work under vacuum and thus is poor in mass productivity.

The present invention has been made to solve the above problems and has a purpose to provide a dyeing method capable of increasing mass productivity while using a vapor deposition transfer dyeing method, and a dyeing deposition apparatus to be used in the method.

Means of Solving the Problems

To achieve the above purpose, one aspect of the invention provides a dyeing method of dyeing an object to be dyed, the method comprising: a first step of placing a sublimable dye and the object to face each other apart at a predetermined distance under normal pressure and heating the sublimable dye to sublimate the sublimable dye toward the object, the distance between the sublimable dye and the object being determined at 0.1 mm or more but 10 mm or less, the heating using a laser beam to sublimate the sublimable dye so that a deposition region of the sublimable dye is a part of a to-be-dyed region of the object; a second step of applying the sublimable dye over the entire to-be-dyed region of the object by relatively moving the object with respect to a sublimation position of the sublimable dye by use of a moving unit to change over time the deposition region on the object with respect to the sublimable dye sublimated in the first step; and a third step of heating at least a part of the region of the object to which the sublimable dye is stuck in the second step by use of a heating unit to dye the object by fixing the sublimable dye stuck to the part of the region.

To achieve the above purpose, another aspect of the invention provides a dye deposition apparatus for depositing a dye on an object to be dyed, the apparatus comprising: a holding unit to hold a base body applied with a sublimable dye and the object to face each other apart at an interval of 0.1 mm or more but 10 mm or less; an irradiation unit to irradiate a laser beam toward the base body; and a moving unit to relatively move the object with respect to the laser beam emitted from the irradiation unit, the moving unit being configured to relatively move the object with respect to the laser beam during laser irradiation to allow the sublimable dye to be sublimated by heat of the laser beam and deposited on the entire to-be-dyed region of the object.

Effects of the Invention

According to the invention, all processes can be conducted under normal pressures while using a vapor deposition transfer dyeing method, and thus mass productivity can be increased.

MODE FOR CARRYING OUT THE INVENTION

Figure 1:
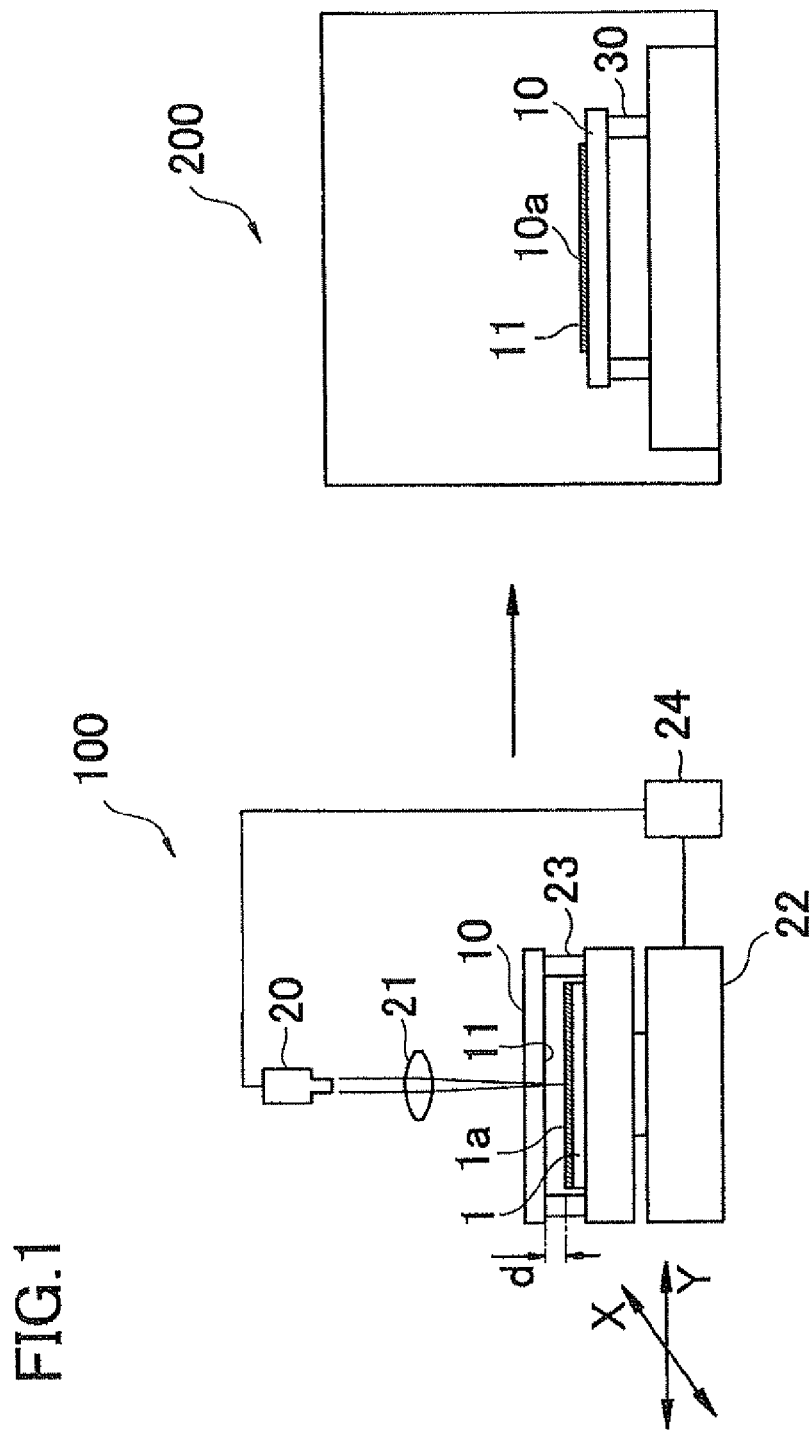
FIG. 1 is a schematic diagram showing a dyeing system to be used in a first embodiment.

A detailed description of a preferred embodiment of the present invention will now be given referring to the accompanying drawings. FIG. 1 is a schematic diagram showing a dyeing system to be used in a first embodiment.

A dyeing system includes a vapor deposition transfer machine 100 (a dye deposition apparatus) for sublimating and depositing (transferring) a sublimable dye toward an object to be dyed ("object") 10, and an oven 200 serving as a heating unit to heat the object 10 with the sublimable dye deposited and thereby dye the object 10. The object 10 used in this embodiment is a plate (a flat plate) made of transparent resin. This transparent resin may include e.g. polycarbonate resin, polyurethane resin, allyl resin, fumaric resin, styrene resin, polymethyl acrylate resin, fibrous resin (e.g., cellulose propionate), high-refractive index materials such as thiourethane materials and thioepoxy materials, etc.

The vapor deposition transfer machine 100 is constituted of a laser source 20, a lens 21, a stage 22, supports 23, a controller (a control section) 24, and others. The laser source 20 is disposed above the stage 22 and operates to emit a laser beam toward the stage 22 to thereby heat an applied region 1a of sublimable dye formed on the base body 1, thereby sublimating the sublimable dye. The lens 21 is placed between the laser source 20 and the stage 22 to focus or collect the laser beam emitted from the laser source 20 onto the base body 1 set on the stage. The laser source 20 and the lens 21 are fixedly held by a fixing member not illustrated. If focusing of the laser beam onto the applied region 1a to heat it is not indispensable, the use of the lens 21 is unnecessary. Further, another configuration may also be adopted in which the laser beam is expanded in diameter by a beam expander used instead of the lens 21 and then the expanded beam is line-focused by a cylindrical lens.

The laser beam to be emitted from the laser source 20 is used to sublimate the sublimable dye. Therefore the laser beam is either the light (a laser beam) having a wavelength in an infrared region to heat the base body 1 and the sublimable dye or the light (a laser beam) having a wavelength absorbable by at least one of the sublimable dye and the base body 1. The laser source is not particularly limited but may be any light sources as long as it can provide a wavelength and output power enough for heating the sublimable dye (or the base body) to sublimate the sublimable dye. For example, a known laser source such as a semiconductor laser source may be used.

The stage 22 includes a table top (an upper surface) on which the base body 1 is to be set and columnar supports 23 arranged at four corners of the table top. The object to be dyed 10 with its surface to be dyed (to-be-dyed surface) facing down is put and held on the supports 23. The stage 22 is configured to be movable on a horizontal plane (in back and forth, right and left directions) by a drive mechanism not shown. The stage 22 is moved based on a moving speed and a moving direction previously set by the control section 24. The control section 24 can also set output power of the laser beam to be emitted from the laser source 20.

The horizontal movement of the stage 22 is performed to change the irradiation position of the laser beam to be emitted from the laser source 20 onto the base body 1 and the deposition position of sublimable dye on the object 10. In this embodiment, the stage 22 is moved in a horizontal direction (X and Y directions) to change the position of the base body 1 and the object 10 with respect to the laser beam, but is not limited thereto. As long as the irradiation position of the laser beam is changed relative to the base body 1 and the object 10, the laser source 20 may instead be moved in the horizontal direction relative to the stage 22. Further, another mechanism may be adopted in which a laser beam emitted from the laser source 20 is irradiated toward the base body 1 through a reflection mirror and the angle of a reflecting surface of the reflection mirror is changed to change the irradiation position of the laser beam with respect to the base body 1 and the object 10.

The supports 23 serve to determine an interval d between the to-be-dyed surface 11 of the object 10 and the base body 1 placed on the table top of the stage 22. This interval d is preferably 0.1 mm or more but 10 mm or less, more preferably 0.5 mm or more but 5 mm or less. If the interval d exceeds 10 mm, dispersion of the sublimable dye sublimated in air when heated by the laser beam results in that a desired dyeing color density could not be obtained or color unevenness is caused.

The base body 1 is a paper or other medium on which dyeing inks containing the sublimable dyes are applied (output) by an ink jet printer not shown to form an applied region 1a. The dyeing inks used in the ink jet printer are a total of three color inks, i.e., at least red, blue, and yellow inks. As the dyes contained in the dyeing inks, dyes that sublime but resist against the heat generated by sublimation have to be used. Preferable dyes are sublimable quinophthalone dyes or sublimable anthraquinone dyes. The present embodiment is arranged to produce the base body 1 formed with the applied region 1a by outputting the dyeing inks onto a print sheet by use of the ink jet printer, but is not limited thereto. A laser printer or other applying means may be used to apply the sublimable dye onto a medium such as a paper. The medium to be used as the base body 1 is not limited to the paper and may be any medium such as a metal sheet and a plastic sheet that allows the sublimable dye to be applied thereon and sublimated therefrom without fixing to the base body.

The oven 200 is used as a heating unit to heat, at a predetermined temperature, the object 10 to which the sublimable dye is stuck by the vapor deposition transfer machine 100, thereby fixing and color-developing the dye. On the to-be-dyed surface 11 of the object 10, the sublimable dye is deposited, forming a dye-deposition region 10a. The object 10 is heated as held on supports 30 provided in the oven 200. The oven 200, which is not particularly limited, may be selected from any known heating devices as long as it can directly or indirectly heat the sublimable dye to fix the sublimable dye to the object 10. For example, the heating devices may include a dry oven capable of heating the entire object 10 by blowing hot air, an oven using an IR heater or a halogen lamp, and others. As another alternative, the entire object 10 is not heated at once and a laser beam for heating is caused to scan the object to partly heat a predetermined region of the object to which the sublimable dye is stuck and fix the sublimable dye stuck to only the heated part (region). With such a heating method, any symbols, characters, design patterns, and others can be dyed in a desired color on the object. In the case of using the laser beam, the laser beam having a wavelength that is absorbed by the object or the sublimable dye is preferably used.

Heating by the oven 200 is performed only for a previously set time needed to heat the inside of the oven to a temperature set as high as possible but not greater than an upper temperature limit of the object 10 and fix the sublimable dye onto the object 10. When the entire object 10 is to be heated at once, an actual heating temperature is about 50 to 200° C. and an actual heating time is about 30 min. to 2 hours with respect to the sublimable dye.

Operations of the dyeing system configured as above will be explained below.

With the ink jet printer not shown loaded with cartridges of red ink, blue ink, and yellow ink, respectively containing red sublimable dye, blue sublimable dye, and yellow sublimable dye, at least one color ink is output on one side of a print sheet. The base body 1 formed with the applied region 1a in a predetermined color is thus produced. Setting of the color of the applied region 1a, setting of the size and the shape of the applied region, and an output command are performed by a general-purpose PC (personal computer) connected to the ink jet printer.

Next, the object 10 to be dyed and the base body 1 having the applied region 1a formed of the inks containing the sublimable dyes are set on the stage 22. At that time, the object 10 is put on the supports 23, and positioned and fixed so that the to-be-dyed surface 11 of the object 10 faces the applied region 1a of the base body 1 at a predetermined interval.

After the base body 1 and the object 10 are set on the stage 22, the control part 24 controls the laser source 20 to irradiate a laser beam at a predetermined output power and controls movement of the stage 22 to make the laser beam scan on the applied region 1a of the base body 1 (i.e., to deposit the sublimable dye over the entire to-be-dyed surface of the object 10). The laser beam emitted from the laser source 20 passes through the object made of transparent resin and then focuses on the base body 1 located under the object.

Figure 2:
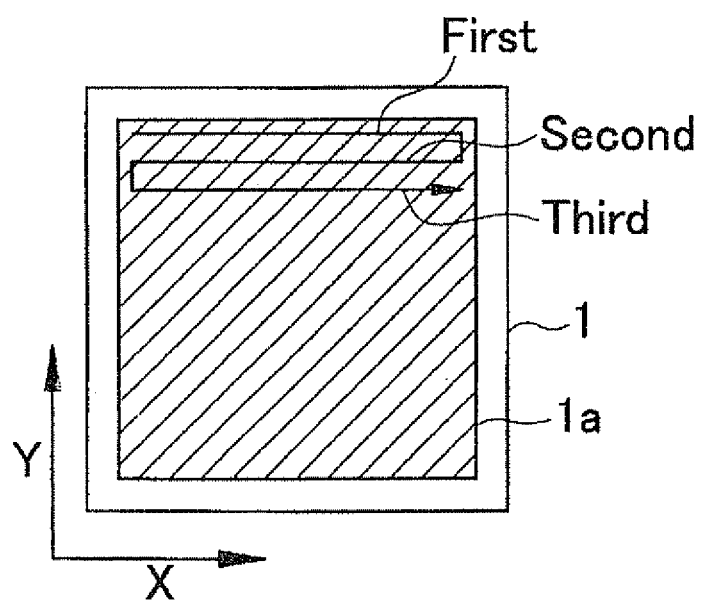
FIG. 2 is a diagram showing a track of movement of a laser beam which is relatively moved with respect to a base body by movement of a stage.

FIG. 2 shows a track of movement of the laser beam focused on the base body 1. In this embodiment, the stage 22 is moved in X and Y directions (back and forth, right and left) to sequentially perform a First scan, a Second scan by return, and a Third scan by return again as shown in FIG. 2. Subsequent scans are performed in the same manner. Each scan is made to deposit (stick) the sublimable dye onto the entire to-be-dyed surface of the object. It is to be noted that the moving speed of the stage 22 (the scanning speed of the laser beam) is not uniformly determined. In the present invention, the speed is set to such a level as to provide a heating time needed to sublimate the sublimable dye in a certain portion of the applied region 1a when the laser beam of a predetermined power is irradiated to the certain portion.

In the case where a sublimable dye is heated and sublimated in air, generally, the sublimated dye is apt to disperse. If the interval between the base body applied with the sublimable dye and the object is wide, the dye sublimated is less likely to stick to the object. In contrast, if the interval between the base body and the object is narrower, the influence of dispersion of the sublimated dye can be suppressed. However, when the applied region coated with the sublimable dye is heated at once, the heat is transferred even to the object due to such a short distance from the base body. This causes a problem with difficulty of depositing the sublimated dye onto the object. According to the present invention, while the interval between the base body and the object is set narrow, the applied region on the base body is partly heated by the laser beam, and the stage is moved to change the heating region (portion) on the applied region over time. This prevents the heat transfer to the object and allows the sublimated dye to be appropriately deposited on the object.

Subsequently, the object 10 with the dye sublimated thereon is put on the supports 30 in the oven 200. This object is heated at a predetermined temperature for a predetermined time to fix the dye on the object, thereby completing dyeing.

In the above embodiment, the laser beam for heating is allowed to pass through the object to thereby irradiate the base body located below, but is not limited thereto. If the object has a narrow width, the laser beam may be made obliquely incident to the base body from an oblique direction to heat the sublimable dye without passing through the object.

Figure 3:
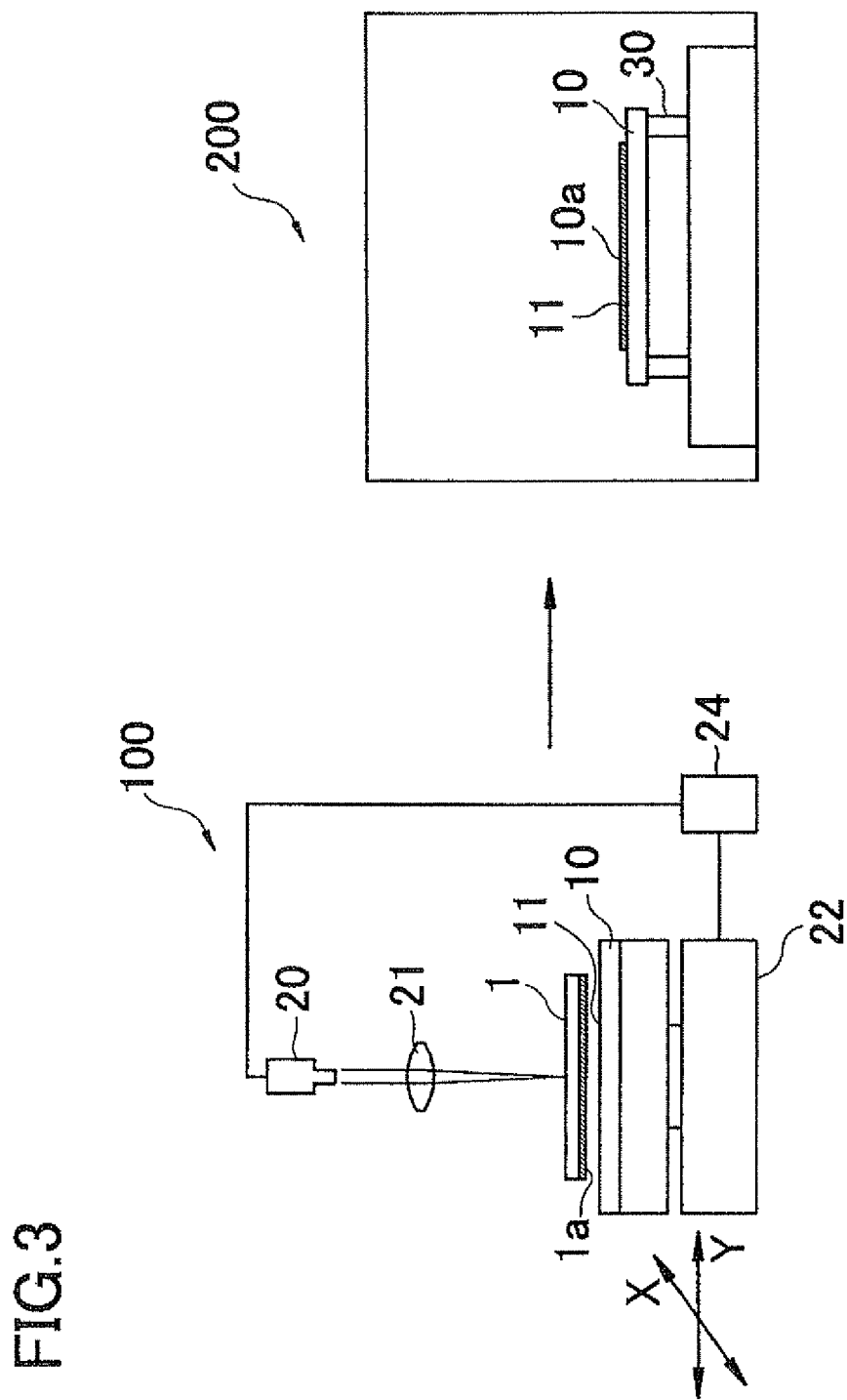
FIG. 3 is a schematic diagram showing a dyeing system to be used in a second embodiment.

Further, a second embodiment will be explained, in which a sublimable dye is deposited on an object under the conditions that a base body is located on an upper side and the object is located on a lower side in air, and then the deposited dye is fixed, referring to FIG. 3. Components having the same functions as those in the first embodiment are given the same reference signs and their details are omitted.

As shown in the figure, the base body 1 is fixedly held above and at a predetermined interval from the object 10 placed on the top surface of the stage 22 by a holding member not illustrated. The holding member is connected to the stage 22. Accordingly, the base body 1 and the object 10 are moved integrally (concurrently) in association with movement of the stage 22 in back and forth, right and left directions (a horizontal direction). Further, the applied region 1a faces the to-be-dyed surface 11 of the object 10. The laser beam is irradiated to a back surface of the base body 1 (an opposite surface to the surface including the applied region 1a). Available media as the base body 1 are the same as those in the first embodiment. Preferably, the back surface of the base body 1 has a black or other color which will absorb heat. The laser source 20 is a light source to emit a laser beam having a wavelength in an infrared range to focus the laser beam on the back surface of the base body 1 and heat the base body 1. In the case where the object is located on the lower side and the base body is located on the upper side, the laser beam does not need to pass through the object and therefore the material of the object may be selected from not only transparent resin but also color resin, fabric, and others. After deposition of the sublimated dye on the object 10, a dye fixing work is performed using the heating unit (the oven 200) as explained above. According to the second embodiment, the laser beam can be directly irradiated to the base body. The object does not need to be transparent. Thus, the number of choices for the object can be increased. Even when the object subjected to a laser beam is located on the upper side and the base body is located on the lower side as shown in FIG. 1, if the object is so narrow in width as to allow oblique irradiation of the laser beam to the base body, colored resin, fabric, and others may be used. For instance, the object may be made of strings or threads.

In the above embodiment, the sublimable dye is prepared in an applied state having a predetermined area on the base body, but not limited thereto. The sublimable dye is required only to be prepared (present) with a predetermined area in a region to be dyed on an object. For example, the sublimable dye may be prepared in the form of pellets. In the above embodiment, the applied region formed on the base body is heated to sublimate the sublimable dye and the base body and the object are moved with respect to the laser beam. The invention is however not limited to the above and may be configured to partly deposit the sublimable dye onto the to-be-dyed surface of the object and change over time a partial region on which the dye to be deposited. To be concrete, for instance, the sublimable dye is provided in the form of pellets and the pellets are heated by a laser beam or other heating unit (contact heating is also available) to sublimate the dye. At that time, the size of the pellets, the distance between the pellets and the object, and other conditions are determined so that a sublimating region of the dye from the pellets is smaller than a region to be dyed, and the dye is deposited partially on the to-be-dyed surface of the object. The object is relatively moved with respect to the sublimating region (sublimating position) of the dye. With this configuration, heat temperature is transferred to the object in a limited way and thus the sublimated dye is appropriately deposited on the object.

In the above embodiment, the sublimable dye is deposited on the object 10 by the vapor deposition transfer machine 100 and then the object 10 with the sublimable dye is set and heated in the oven 200. The invention is however not limited to this manner. For instance, the stage 22 may be utilized as an automatic carrying unit from the vapor deposition transfer machine 100 to the oven 200 to thereby consecutively perform deposition of sublimable dye onto an object and a fixing process of the sublimable dye.

Concrete examples will be explained below.

Example 1

1. Test Conditions (1) With the dyeing system used in the aforementioned first embodiment, a polycarbonate plate (50 mm×50 mm×2 mm) was subjected to dyeing in air. The printer used for producing a base body was EPSON MJ-8000C and the ink was TTS INK RED NK-1 made by Nidek Co., Ltd. containing a red sublimable dye. The base body was produced by forming a red applied region on a print sheet.

(2) Under the conditions that the interval between the base body and the polycarbonate plate was 0.8 mm and the moving speed of the stage during laser irradiation was 1 mm/s, a laser source NDV7113E (wavelength: 405 nm) made by Nichia Corporation was used to irradiate a laser beam at a power of 0.1 W onto the base body. During laser irradiation, the stage was controlled to move so as to deposit the sublimable dye over the entire region to be dyed on the polycarbonate plate.

(3) The polycarbonate plate deposited with the sublimable dye was put in an oven (DKN612 made by Yamato Scientific Co., Ltd.) and then subjected to a fixing work for heating at 130° C. for one hour, thereby completing dyeing.

2. Results

As a result of visual check on the dyed polycarbonate plate, it was found that the plate was dyed in desired color density without damages on the plate surface.

Example 2

1. Test Conditions (1) Under the same conditions as those in Example 1, a base body with a red applied region was obtained.
(2) Under the conditions that the interval between the base body and the polycarbonate plate was 1 mm and the moving speed of the stage during laser irradiation was 6 mm/s, a laser source TOLD-45-CPXF1-K (wavelength: 808 nm) made by Jena Optics Corporation was used to irradiate a laser beam at a power of 2.5 W onto the base body. During laser irradiation, as in Example 1, the stage was controlled to move so as to deposit the sublimable dye over the entire region to be dyed on the polycarbonate plate.
(3) The polycarbonate plate deposited with the sublimable dye was put in the an oven (DKN612 made by Yamato Scientific Co., Ltd.) and then subjected to a fixing work for heating at 130° C. for one hour, thereby completing dyeing.

2. Results

As a result of visual check on the dyed polycarbonate plate, it was found that the plate was dyed in desired color density without damages on the plate surface.

Example 3

1. Test Conditions (1) Under the same conditions as those in Example 1, a base body with a red applied region was produced.
(2) Under the conditions that the interval between the base body and the polycarbonate plate was 3 mm and the moving speed of the stage during laser irradiation was 6 mm/s, a laser source TOLD-45-CPXF1-K (wavelength: 808 nm) made by Jena Optics Corporation was used to irradiate a laser beam at a power of 5 W onto the base body. During laser irradiation, as in Example 1, the stage was controlled to move so as to deposit the sublimable dye over the entire region to be dyed on the polycarbonate plate.
(3) The polycarbonate plate deposited with the sublimable dye was put in the oven (DKN612 made by Yamato Scientific Co., Ltd.) and then subjected to a fixing work for heating at 130° C. for one hour, thereby completing dyeing.

2. Results

As a result of visual check on the dyed polycarbonate plate, it was found that the plate was dyed in desired color density without damages on the plate surface.

DESCRIPTION OF THE REFERENCE SIGNS

1 Base body
1a Applied region
10 Object to be dyed
20 Laser source
22 Stage
24 Control section
100 Vapor deposition transfer machine
200 Oven

The invention claimed is:

1. A dyeing method of dyeing an object to be dyed, the method comprising:
　a first step of placing a sublimable dye and the object to face each other apart at a predetermined distance under normal pressure and heating the sublimable dye to sublimate the sublimable dye toward the object, the distance between the sublimable dye and the object being determined at 0.1 mm or more but 10 mm or less, the heating using a laser beam to sublimate the sublimable dye so that a deposition region of the sublimable dye is a part of a to-be-dyed region of the object;
　a second step of applying the sublimable dye over the entire to-be-dyed region of the object by relatively moving the object with respect to a sublimation position of the sublimable dye by use of a moving unit to change over time the deposition region on the object with respect to the sublimable dye sublimated in the first step; and
　a third step of heating at least a part of the region of the object to which the sublimable dye is stuck in the second step by use of a heating unit to dye the object by fixing the sublimable dye stuck to the part of the region.

2. The dyeing method according to claim 1, wherein the sublimable dye is applied on the base body, and the first step includes moving the object and the base body applied with the sublimable dye with respect to the laser beam to move the sublimation position of the sublimable dye in the to-be-dyed region.

3. The dyeing method according to claim 2, wherein the laser beam is a light having a wavelength absorbable by the sublimable dye and/or the base body or a light having a wavelength in an infrared region.

4. The dyeing method according to claim 3, wherein the heating unit used in the third step is a laser irradiation unit arranged to emit the light having a wavelength absorbable by the sublimable dye and/or the base body or the light having a wavelength in an infrared region.

5. A dye deposition apparatus for depositing a dye on an object to be dyed, the apparatus comprising:
　a holding unit configured to hold a base body applied with a sublimable dye and the object to face each other apart at an interval of 0.1 mm or more but 10 mm or less;
　an irradiation unit configured to irradiate a laser beam toward the base body; and
　a moving unit configured to relatively move the object with respect to the laser beam emitted from the irradiation unit,
　the moving unit being configured to relatively move the object with respect to the laser beam during laser irradiation to allow the sublimable dye to be sublimated by heat of the laser beam and deposited on the entire to-be-dyed region of the object.

6. The dye deposition apparatus according to claim 5, wherein the moving unit integrally moves the object and the base body to change an irradiation position of the laser beam on the base body and a deposition position of the sublimable dye on the object.

7. The dye deposition apparatus according to claim 5, wherein the holding unit is configured to hold a base body applied with a sublimable dye and the object to face each other apart at an interval of 0.1 mm or more but 10 mm or less at normal pressure.

* * * * *